United States Patent
Beerends

(10) Patent No.: US 9,472,202 B2
(45) Date of Patent: Oct. 18, 2016

(54) METHOD OF AND APPARATUS FOR EVALUATING INTELLIGIBILITY OF A DEGRADED SPEECH SIGNAL

(71) Applicant: Nederlandse Organisatie voor toegepast-natuurwetenschappelijk onderzoek TNO, 's-Gravenhage (NL)

(72) Inventor: John Gerard Beerends, 's-Gravenhage (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 14/442,953

(22) PCT Filed: Nov. 15, 2013

(86) PCT No.: PCT/NL2013/050824
§ 371 (c)(1),
(2) Date: May 14, 2015

(87) PCT Pub. No.: WO2014/077690
PCT Pub. Date: May 22, 2014

(65) Prior Publication Data
US 2015/0340047 A1    Nov. 26, 2015

(30) Foreign Application Priority Data

Nov. 16, 2012 (EP) .................................. 12193082

(51) Int. Cl.
*G10L 19/00* (2013.01)
*G10L 21/02* (2013.01)
*G10L 25/69* (2013.01)
(Continued)

(52) U.S. Cl.
CPC ............... *G10L 21/02* (2013.01); *G10L 25/69* (2013.01); *G10L 19/005* (2013.01); *G10L 21/0208* (2013.01); *G10L 25/21* (2013.01); *G11C 7/16* (2013.01); *G11C 2207/16* (2013.01)

(58) Field of Classification Search
USPC ....... 704/201, 206, 216, 224, 225, 226, 227, 704/228, 230, 203
See application file for complete search history.

(56) References Cited

U.S. PATENT DOCUMENTS

2010/0211395 A1* 8/2010 Beerends ................ G10L 25/69
704/270

OTHER PUBLICATIONS

"ITU-T P.863 Perceptual Objective Listening quality Assessment. Edition 1.0" Jan. 13, 2011, International Telecommunication Union.
(Continued)

*Primary Examiner* — Vu B Hang
(74) *Attorney, Agent, or Firm* — Banner & Witcoff, Ltd.

(57) ABSTRACT

The present invention relates to a method of evaluating intelligibility of a degraded speech signal received from an audio transmission system conveying a reference speech signal. The method comprises sampling said signals into reference and degraded signal frames, and forming frame pairs by associating reference and degraded signal frames with each other. For each frame pair a difference function representing disturbance is provided, which is then compensated for specific disturbance types for providing a disturbance density function. Based on the density function of a plurality of frame pairs, an overall quality parameter is determined. The method provides for compensating the overall quality parameter for the effect that the assessment of intelligibility of CVC words is dominated by the intelligibility of consonants.

16 Claims, 6 Drawing Sheets

(51) Int. Cl.
  *G10L 21/0208* (2013.01)
  *G11C 7/16* (2006.01)
  *G10L 19/005* (2013.01)
  *G10L 25/21* (2013.01)

(56) References Cited

OTHER PUBLICATIONS

Anonymous: "Perceptual Objective Listening Quality Analysis, Technical White Paper", POLQA Coalition, Oct. 2011, pp. 1-8.
Beerends John G et al: "Objective Speech Intelligibility Measurement on the Basis of Natural Speech in Combination with Perceptual Modeling", JAES, vol. 57, No. 5, May 1, 2009.
Fogerty Daniel et al: "Perceptual contributions to monosyllabic word intelligibility: Segmental. lexical. and noise replacement factors", The Journal of the Acoustical Society of America, vol. 128, No. 5, Nov. 1, 2010.
International Search Report—PCT/NO2013/050824—Dated Mar. 4, 2014.
"ITU-T P.862 Perceptual Evaluation of Speech Quality (PESQ)" 2000, International Telecommunication Union.
Perceptual Speech Quality Measure (PSQM) ITU-T Recommendation P.861, (1996).

\* cited by examiner

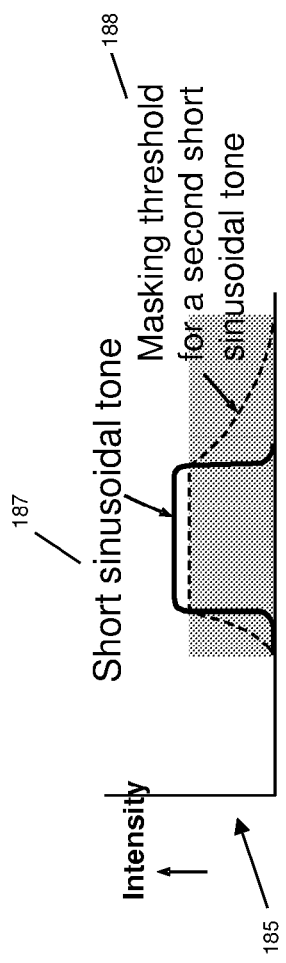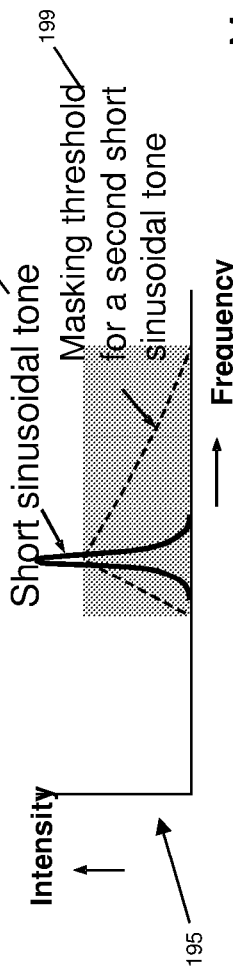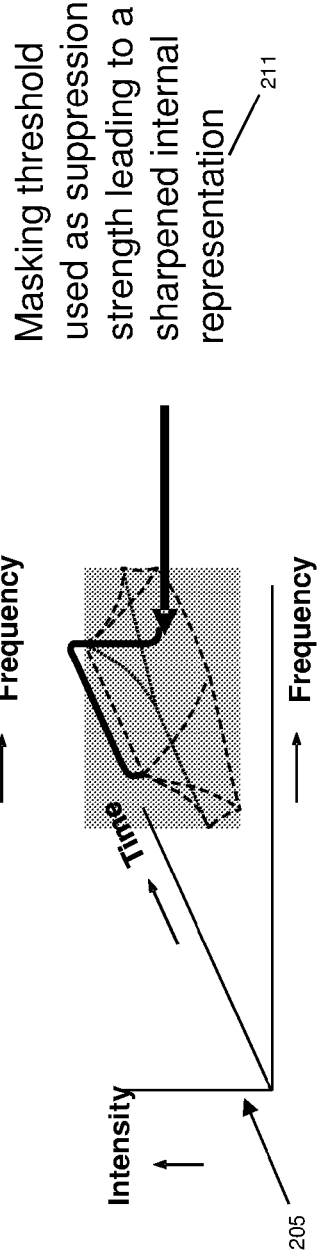

METHOD OF AND APPARATUS FOR EVALUATING INTELLIGIBILITY OF A DEGRADED SPEECH SIGNAL

CROSS-REFERENCE TO RELATED APPLICATIONS

This application is a U.S. National Stage application under 35 U.S.C. §371 of International Application PCT/NL2013/050824 (published as WO 2014/077690 A1), filed Nov. 15, 2013, which claims priority to Application EP 12193082.0, filed Nov. 16, 2012. Benefit of the filing date of each of these prior applications is hereby claimed. Each of these prior applications is hereby incorporated by reference in its entirety.

FIELD OF THE INVENTION

The present invention relates to a method of evaluating intelligibility of a degraded speech signal received from an audio transmission system, by conveying through said audio transmission system a reference speech signal such as to provide said degraded speech signal, wherein the method comprises: sampling said reference speech signal into a plurality of reference signal frames and determining for each frame a reference signal representation; sampling said degraded speech signal into a plurality of degraded signal frames and determining for each frame a degraded signal representation; forming frame pairs by associating each reference signal frame with a corresponding degraded signal frame, and providing for each frame pair a difference function representing a difference between said degraded signal frame and said associated reference signal frame.

The present invention further relates to an apparatus for performing a method as described above, and to a computer program product.

BACKGROUND

During the past decades objective speech quality measurement methods have been developed and deployed using a perceptual measurement approach. In this approach a perception based algorithm simulates the behaviour of a subject that rates the quality of an audio fragment in a listening test. For speech quality one mostly uses the so-called absolute category rating listening test, where subjects judge the quality of a degraded speech fragment without having access to the clean reference speech fragment. Listening tests carried out within the International Telecommunication Union (ITU) mostly use an absolute category rating (ACR) 5 point opinion scale, which is consequently also used in the objective speech quality measurement methods that were standardized by the ITU, Perceptual Speech Quality Measure (PSQM (ITU-T Rec. P.861, 1996)), and its follow up Perceptual Evaluation of Speech Quality (PESQ (ITU-T Rec. P.862, 2000)). The focus of these measurement standards is on narrowband speech quality (audio bandwidth 100-3500 Hz), although a wideband extension (50-7000 Hz) was devised in 2005. PESQ provides for very good correlations with subjective listening tests on narrowband speech data and acceptable correlations for wideband data.

As new wideband voice services are being rolled out by the telecommunication industry the need emerged for an advanced measurement standard of verified performance, and capable of higher audio bandwidths. Therefore ITU-T (ITU-Telecom sector) Study Group 12 initiated the standardization of a new speech quality assessment algorithm as a technology update of PESQ. The new, third generation, measurement standard, POLQA (Perceptual Objective Listening Quality Assessment), overcomes shortcomings of the PESQ P.862 standard such as incorrect assessment of the impact of linear frequency response distortions, time stretching/compression as found in Voice-over-IP, certain type of codec distortions and reverberations.

Although POLQA (P.863) provides a number of improvements over the former quality assessment algorithms PSQM (P.861) and PESQ (P.862), the present versions of POLQA, like PSQM and PESQ, fails to address an elementary subjective perceptive quality condition, namely intelligibility. Despite also being dependent on a number of audio quality parameters, intelligibility is more closely related to information transfer than to the quality of sound. In terms of the quality assessment algorithms, the nature of intelligibility as opposed to sound quality causes the algorithms to yield an evaluation score that mismatches the score that would have been assigned if the speech signal had been evaluated by a person or an audience. Keeping in focus the objective of information sharing, a human being will value an intelligible speech signal above a signal which is less intelligible but which is similar in terms of sound quality.

Although much progression is achieved, the present models in a number of cases still unexpectedly fail to correctly predict human intelligibility evaluation scores.

SUMMARY OF THE INVENTION

It is an object of the present invention to seek a solution for the abovementioned disadvantage of the prior art, and to provide a quality assessment algorithm for assessment of (degraded) speech signals which is adapted to take intelligibility of the speech signal into account for the evaluation thereof in a manner which most closely approaches human assessment.

The present invention achieves this and other objects in that there is provided a method of evaluating intelligibility of a degraded speech signal received from an audio transmission system, by conveying through said audio transmission system a reference speech signal such as to provide said degraded speech signal. The reference speech signal at least represents (conveys) one or more words made up of combinations of consonants and vowels. The reference speech signal is sampled into a plurality of reference signal frames, and the degraded speech signal is sampled into a plurality of degraded signal frames. Frame pairs are formed by associating the reference signal frames and the degraded signal frames with each other. According to the method for each frame pair a difference function is provided representing a difference between said degraded signal frame and said associated reference signal frame. The difference function is compensated for one or more disturbance types such as to provide for each frame pair a disturbance density function which is adapted to a human auditory perception model. From the disturbance density functions of a plurality of frame pairs, an overall quality parameter is derived. The overall quality parameter is at least indicative of the intelligibility of said degraded speech signal. In particular, the method also includes identifying, for at least one of the words conveyed by the reference speech signal, a reference signal part and a degraded signal part associated with at least one consonant of the at least one word. From the identified reference and degraded signal parts, a degree of disturbance of the degraded speech signal is determined, based on a comparison of signal powers in the degraded signal part and the reference signal part. The overall quality parameter is then compensated dependent on the determined degree of disturbance of the degraded speech signal associated with the at least one consonant.

The present invention addresses intelligibility by recognising that noise and other disturbances that coincide with consonants of words in a speech signal are considered more annoying and destructive to the information transfer than similar disturbances coinciding with vowels. This is related to the fact that vowels are typically spoken louder than consonants. Moreover, the perception of most types of disturbances on average appears to be more similar to that of consonants, whereas vowels are more distinctive. Therefore, in presence of relatively loud disturbance, vowels are often perceived correctly whereas consonants are more often misperceived resulting in failure of information transfer. The method of the present invention takes this aspect correctly into account by compensating the obtained overall quality parameter (i.e. the simulated human evaluation score) for the amount of disturbance experienced in the degraded speech signal coinciding with consonants in the degraded speech signal.

In accordance with an embodiment of the invention, the step of identifying comprises comparing a signal power of each of a plurality of degraded signal frames and reference signal frames with a first threshold and a second threshold, and considering the degraded signal frame or the reference signal frame as being associated with the at least one consonant if said signal power is larger than the first threshold and smaller than the second threshold.

Signal parts that relate to consonants in the reference (or degraded) speech signal may be recognized based on the signal power in the signal. In particular, considering the (clean, i.e. optimized) reference signal, since vowels are typically spoken louder than consonants, comparing the reference signal against an upper threshold enables to exclude the vowels from the signal parts to be analyzed. Moreover, by comparing the signal power in the reference speech signal against a lower threshold, the silent parts carrying no speech information may also be excluded. Therefore, by comparing the signal power of the reference speech signal against a lower and an upper threshold enables to identify the signal parts associated with consonants in the speech signal.

The corresponding signal parts associated with consonants in the degraded speech signal are found by a time align routine that identifies reference signal frames that correspond to signal frames of the degraded signal parts. The degraded speech signal frames may also be obtained from the frame pairs associated with the identified reference signal parts.

In accordance with another embodiment of the present invention, the signal power for each degraded signal frame is calculated in a first frequency domain, and the signal power in each reference signal frame is calculated in the second frequency domain. The first frequency domain includes a first frequency range of spoken voice and audible noise, while the second frequency domain includes a second frequency range of (at least) spoken voice. In particular, and in accordance with a further embodiment, the first frequency range may be between 300 hertz and 8000 hertz, and the second frequency range may be between 300 hertz and 3500 hertz. This difference between frequency domains used for calculating the signal power of degraded signal frames and reference signal frames respectively, allows to idealize the reference signal frame by excluding any frequency components outside the speech range, while at the same time, audible disturbance in the degraded speech signal are taken into account by the wider frequency range used for the degraded signal frames.

In accordance with a further embodiment of the present invention, the step of identifying comprises identifying, for the reference speech signal the active speech signal frames for which signal powers are between a first and second threshold, and soft speech signal frames for which signal powers are between a third and fourth threshold, and associating said active speech signal frames and soft speech signal frames with degraded signal frames such as to yield: active speech reference signal frames, soft speech reference signal frames, and its associated active speech degraded signal frames, and soft speech degraded signal frames; and wherein said comparison of signal powers comprises comparing signal powers of said active speech reference signal frames, said soft speech reference signal frames, said active speech degraded signal frames, and said soft speech degraded signal frames with each other.

The above preferred embodiment allows to take the effect of disturbances during consonants in the speech signal more accurately into account, since this enables to compensate the overall quality parameter differently for disturbances taking place during the more critical soft speech signal parts as compared to the less critical active speech signal part. According to a further embodiment of the invention, the first threshold is smaller than said third threshold, third threshold is smaller than said fourth threshold, and said fourth threshold is smaller than said second threshold. In accordance with this embodiment, the active speech signal parts correspond to a wider power range of signal powers than the soft speech signal parts. In particular, the second threshold may be selected such as to exclude reference signal parts and its associated degraded signal parts which are associated with one or more vowels in the words that are represented by the speech signal. As explained here and above, vowels are typically spoken louder than consonants in a speech signal.

In accordance with a preferred embodiment of the present invention, the comparison of signal powers comprises calculating an average active speech reference signal part signal power $P_{active,\ ref,\ average}$; calculating an average soft speech reference signal part signal power $P_{soft,\ ref,\ average}$; calculating an average active speech degraded signal part signal power $P_{active,\ degraded,\ average}$; calculating an average soft speech degraded signal part signal power $P_{soft,\ degraded,\ average}$; and determining the degree of disturbance of the degraded speech signal by calculating a consonant-vowel-consonant signal-to-noise ratio compensation parameter $CVC_{SNR\_factor}$ as:

$$CVC_{SNR\_factor} = \frac{(\Delta_2 + (P_{soft,degraded,average} + \Delta_1)/(P_{active,degraded,average} + \Delta_1))}{(\Delta_2 + (P_{soft,ref,average} + \Delta_1)/(P_{active,ref,average} + \Delta_1))}$$

wherein $\Delta_1$ and $\Delta_2$ are constants.

Using the $CVC_{SNR\_factor}$ as defined here and above, a very accurate parameter is obtained for taken into account disturbance during consonants which most closely approaches human assessment of such disturbances typically experienced in degraded speech signals. With respect to the above, it is noted that the constants $\Delta_1$ and $\Delta_2$ are added in order to prevent a division by zero and to adapt the behavior of the model to the behavior of subjects.

This type of compensating the overall quality parameter may be performed in a number of different manners. In particular, and advantageously the calculated overall quality parameter using the disturbance density functions described above, may be multiplied with a compensation factor. According to a particular embodiment, the compensation factor may be 1.0 in case the consonant-vowel-consonant signal-to-noise ratio compensation parameter $CVC_{SNR\_factor}$ is larger than 0.75, while the compensation factor is $(CVC_{SNR\_factor}+0.25)^{1/2}$ in case the consonant-vowel-consonant signal-to-noise ratio compensation parameter $CVC_{SNR\_factor}$ is smaller than 0.75. In this embodiment, the overall quality parameter is only compensated in case of relatively loud disturbances during the critical part of consonants. Any disturbance experienced during vowels in the speech signal is not taken into account. Moreover, small disturbances are also excluded from the compensation.

The invention is not restricted to a particular sequence of method steps. Although compensating of the overall quality parameter may be implemented anywhere in the method, the compensation may easily be performed near the end of the method, e.g. prior to providing the overall intelligibility parameter at the output of the method. Moreover, without restricting the method to a certain sequence of steps, the step of identifying the reference and/or degraded signal parts may be performed advantageously after sampling of the frames and before providing of the difference function.

According to a second aspect, the invention is directed to a computer program product comprising a computer executable code for performing a method as described above when executed by a computer.

According to a third aspect, the invention is directed to an apparatus for performing a method according to the first aspect for evaluating intelligibility of a degraded speech signal, comprising: a receiving unit for receiving said degraded speech signal from an audio transmission system conveying a reference speech signal, the reference speech signal at least representing one or more words made up of combinations of consonants and vowels, and the receiving unit further arranged for receiving the reference speech signal; a sampling unit for sampling of said reference speech signal into a plurality of reference signal frames, and for sampling of said degraded speech signal into a plurality of degraded signal frames; a processing unit for forming frame pairs by associating said reference signal frames and said degraded signal frames with each other, and for providing for each frame pair a difference function representing a difference between said degraded and said reference signal frame; a compensator unit for compensating said difference function for one or more disturbance types such as to provide for each frame pair a disturbance density function which is adapted to a human auditory perception model; and said processing unit further being arranged for deriving from said disturbance density functions of a plurality of frame pairs an overall quality parameter being at least indicative of said intelligibility of said degraded speech signal; wherein, said processing unit is further arranged: for identifying, for at least one of said words represented by the reference speech signal, a reference signal part and a degraded signal part associated with at least one consonant of the at least one word; for determining, from the identified reference and degraded signal parts, a degree of disturbance of the degraded speech signal based on a comparison of signal powers in the degraded signal part and the reference signal part; and for compensating the overall quality parameter dependent on the determined degree of disturbance of the degraded speech signal associated with the at least one consonant.

BRIEF DESCRIPTION OF THE DRAWINGS

The present invention is further explained by means of specific embodiments, with reference to the enclosed drawings, wherein:

FIG. 5 is a schematic overview of a masking approach used in the POLQA model in an embodiment in accordance with the invention;

DETAILED DESCRIPTION

POLQA Perceptual Model

The basic approach of POLQA (ITU-T rec. P.863) is the same as used in PESQ (ITU-T rec. P.862), i.e. a reference input and degraded output speech signal are mapped onto an internal representation using a model of human perception. The difference between the two internal representations is used by a cognitive model to predict the perceived speech quality of the degraded signal. An important new idea implemented in POLQA is the idealisation approach which removes low levels of noise in the reference input signal and optimizes the timbre. Further major changes in the perceptual model include the modelling of the impact of play back level on the perceived quality and a major split in the processing of low and high levels of distortion.

Figure 1:
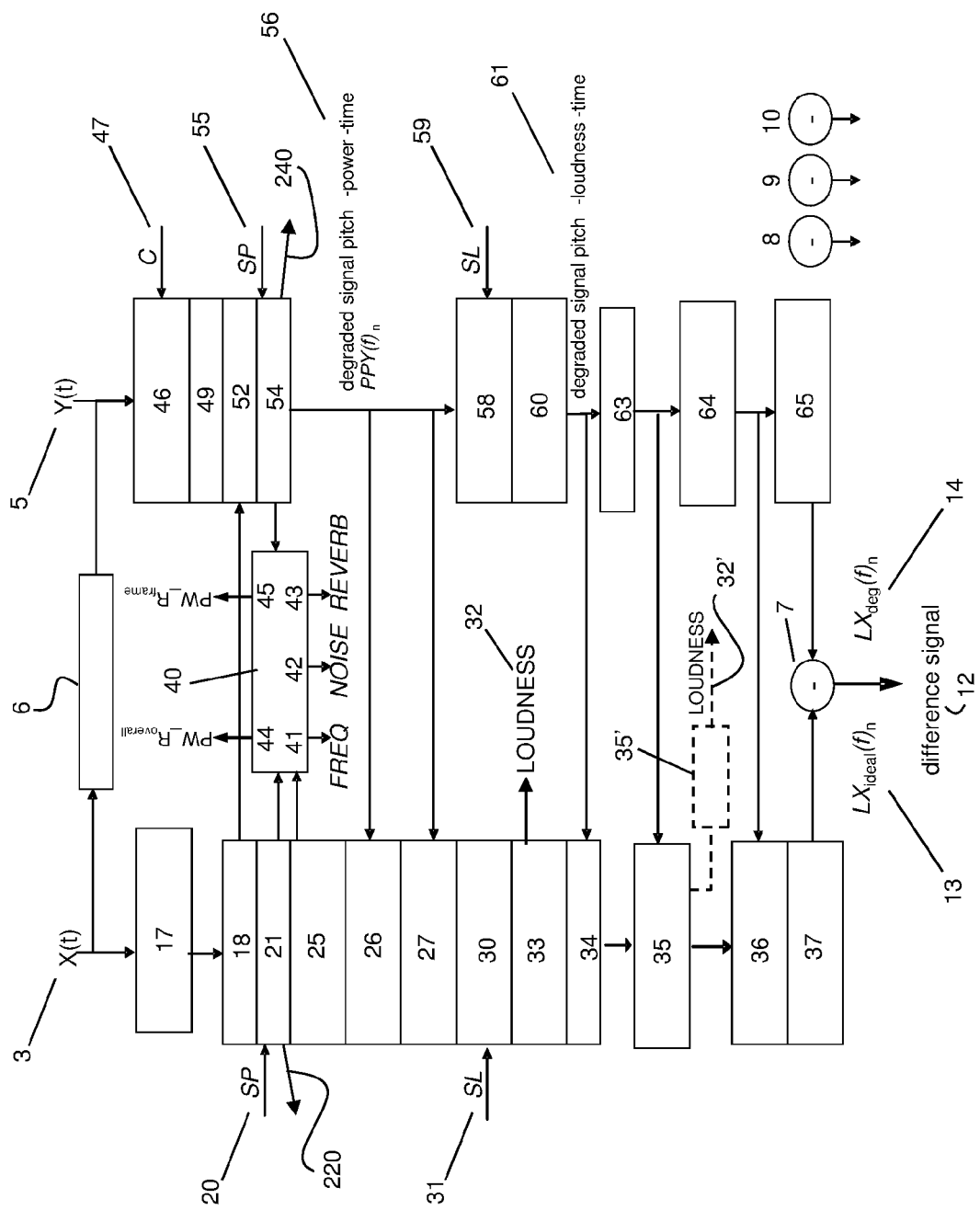
FIG. 1 provides an overview of the first part of the POLQA perceptual model in an embodiment in accordance with the invention.

An overview of the perceptual model used in POLQA is given in FIG. 1 through 4. FIG. 1 provides the first part of the perceptual model used in the calculation of the internal representation of the reference input signal X(t) 3 and the degraded output signal Y(t) 5. Both are scaled 17, 46 and the internal representations 13, 14 in terms of pitch-loudness-time are calculated in a number of steps described below, after which a difference function 12 is calculated, indicated in FIG. 1 with difference calculation operator 7. Two different flavours of the perceptual difference function are calculated, one for the overall disturbance introduced by the system using operators 7 and 8 under test and one for the added parts of the disturbance using operators 9 and 10. This models the asymmetry in impact between degradations caused by leaving out time-frequency components from the reference signal as compared to degradations caused by the introduction of new time-frequency components. In POLQA both flavours are calculated in two different approaches, one focussed on the normal range of degradations and one focussed on loud degradations resulting in four difference function calculations 7, 8, 9 and 10 indicated in FIG. 1.

Figure 2:
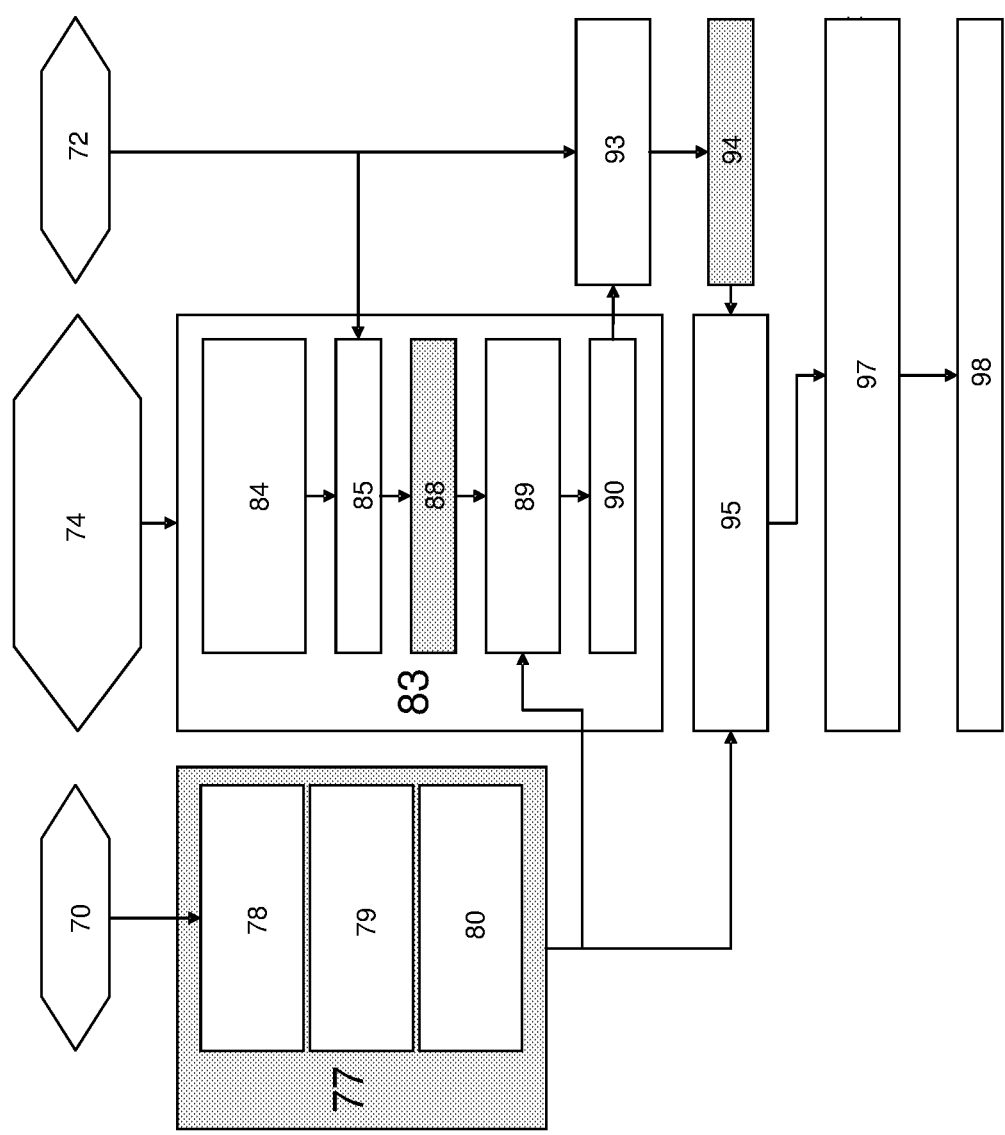
FIG. 2 provides an illustrative overview of the frequency alignment used in the POLQA perceptual model in an embodiment in accordance with the invention.

For degraded output signals with frequency domain warping 49 an align algorithm 52 is used given in FIG. 2. The final processing for getting the MOS-LQO scores is given in FIG. 3 and FIG. 4.

POLQA starts with the calculation of some basic constant settings after which the pitch power densities (power as function of time and frequency) of reference and degraded are derived from the time and frequency aligned time signals. From the pitch power densities the internal representations of reference and degraded are derived in a number of steps. Furthermore these densities are also used to derive 40 the first three POLQA quality indicators for frequency response distortions 41 (FREQ), additive noise 42 (NOISE) and room reverberations 43 (REVERB). These three quality indicators 41, 42 and 43 are calculated separately from the main disturbance indicator in order to allow a balanced impact analysis over a large range of different distortion types. These indicators can also be used for a more detailed analysis of the type of degradations that were found in the speech signal using a degradation decomposition approach.

As stated four different variants of the internal representations of reference and degraded are calculated in 7, 8, 9 and 10; two variants focussed on the disturbances for normal and big distortions, and two focussed on the added disturbances for normal and big distortions. These four different variants 7, 8, 9 and 10 are the inputs to the calculation of the final disturbance densities.

The internal representations of the reference 3 are referred to as ideal representations because low levels of noise in the reference are removed (step 33) and timbre distortions as found in the degraded signal that may have resulted from a non optimal timbre of the original reference recordings are partially compensated for (step 35).

The four different variants of the ideal and degraded internal representations calculated using operators 7, 8, 9 and 10 are used to calculate two final disturbance densities 142 and 143, one representing the final disturbance 142 as a function of time and frequency focussed on the overall degradation and one representing the final disturbance 143 as a function of time and frequency but focussed on the processing of added degradation.

Figure 4:
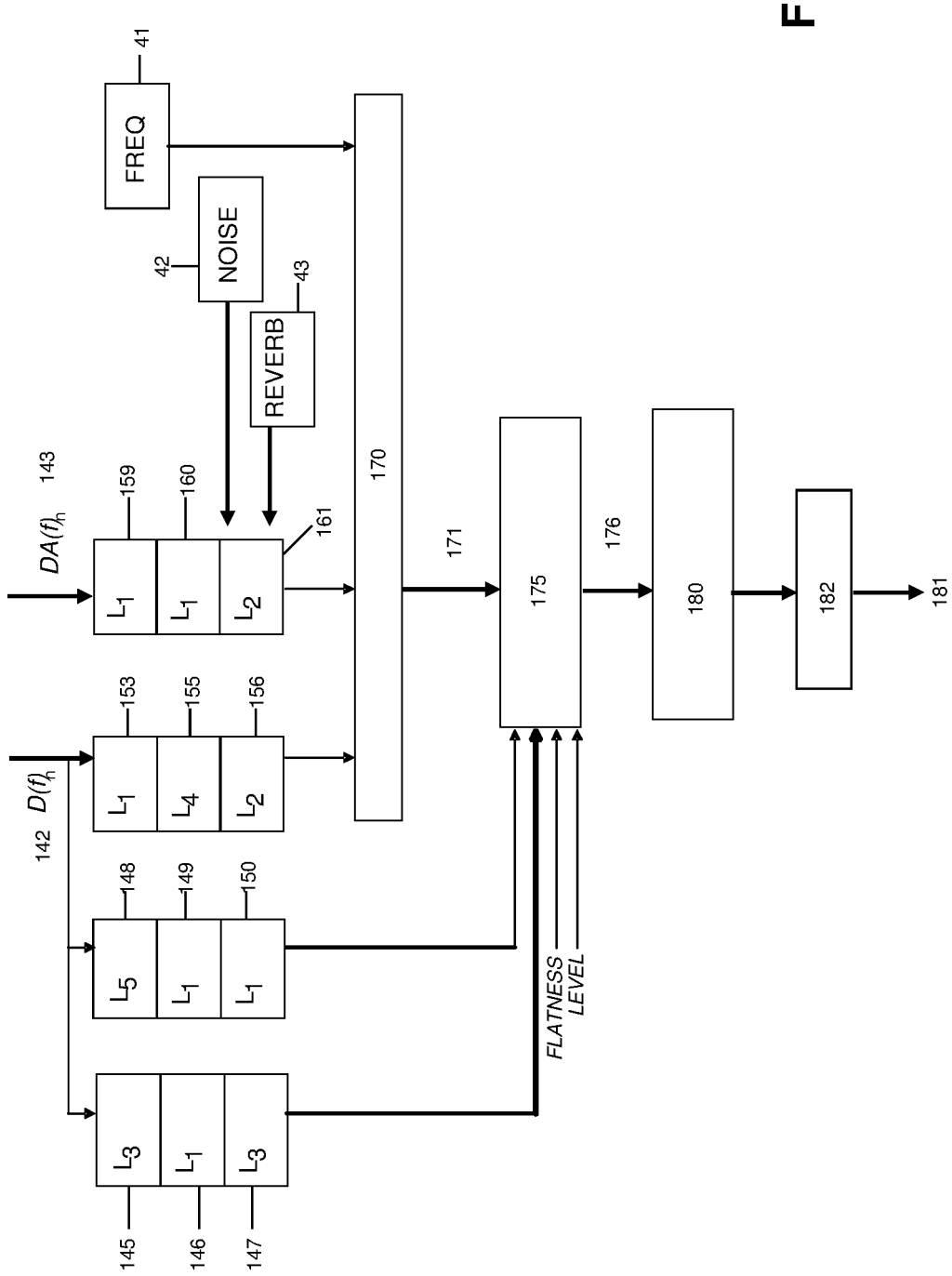
FIG. 4 is an overview of the third part of the POLQA perceptual model in an embodiment in accordance with the invention.

FIG. 4 gives an overview of the calculation of the MOS-LQO, the objective MOS score, from the two final disturbance densities 142 and 143 and the FREQ 41, NOISE 42, REVERB 43 indicators.

Pre-Computation of Constant Settings

FFT Window Size Depending on the Sample Frequency

POLQA operates on three different sample rates, 8, 16, and 48 kHz sampling for which the window size W is set to respectively 256, 512 and 2048 samples in order to match the time analysis window of the human auditory system. The overlap between successive frames is 50% using a Hann window. The power spectra—the sum of the squared real and squared imaginary parts of the complex FFT components—are stored in separate real valued arrays for both, the reference and the degraded signal. Phase information within a single frame is discarded in POLQA and all calculations are based on the power representations, only.

Start Stop Point Calculation

In subjective tests, noise will usually start before the beginning of the speech activity in the reference signal. However one can expect that leading steady state noise in a subjective test decreases the impact of steady state noise while in objective measurements that take into account leading noise it will increase the impact; therefore it is expected that omission of leading and trailing noises is the correct perceptual approach. Therefore, after having verified the expectation in the available training data, the start and stop points used in the POLQA processing are calculated from the beginning and end of the reference file. The sum of five successive absolute sample values (using the normal 16 bits PCM range −+32,000) must exceed 500 from the beginning and end of the original speech file in order for that position to be designated as the start or end. The interval between this start and end is defined as the active processing interval. Distortions outside this interval are ignored in the POLQA processing.

The Power and Loudness Scaling Factor SP and SL

For calibration of the FFT time to frequency transformation a sine wave with a frequency of 1000 Hz and an amplitude of 40 dB SPL is generated, using a reference signal X(t) calibration towards 73 dB SPL. This sine wave is transformed to the frequency domain using a windowed FFT in steps 18 and 49 with a length determined by the sampling frequency for X(t) and Y(t) respectively. After converting the frequency axis to the Bark scale in 21 and 54 the peak amplitude of the resulting pitch power density is then normalized to a power value of $10^4$ by multiplication with a power scaling factor SP 20 and 55 for X(t) and Y(t) respectively.

The same 40 dB SPL reference tone is used to calibrate the psychoacoustic (Sone) loudness scale. After warping the intensity axis to a loudness scale using Zwicker's law the integral of the loudness density over the Bark frequency scale is normalized in 30 and 58 to 1 Sone using the loudness scaling factor SL 31 and 59 for X(t) and Y(t) respectively.

Scaling and Calculation of the Pitch Power Densities

The degraded signal Y(t) 5 is multiplied 46 by the calibration factor C 47, that takes care of the mapping from dB overload in the digital domain to dB SPL in the acoustic domain, and then transformed 49 to the time-frequency domain with 50% overlapping FFT frames. The reference signal X(t) 3 is scaled 17 towards a predefined fixed optimal level of about 73 dB SPL equivalent before it's transformed 18 to the time-frequency domain. This calibration procedure is fundamentally different from the one used in PESQ where both the degraded and reference are scaled towards predefined fixed optimal level. PESQ pre-supposes that all play out is carried out at the same optimal playback level while in the POLQA subjective tests levels between 20 dB to +6 to relative to the optimal level are used. In the POLQA perceptual model one can thus not use a scaling towards a predefined fixed optimal level.

After the level scaling the reference and degraded signal are transformed 18, 49 to the time-frequency domain using the windowed FFT approach. For files where the frequency axis of the degraded signal is warped when compared to the reference signal a dewarping in the frequency domain is carried out on the FFT frames. In the first step of this dewarping both the reference and degraded FFT power spectra are preprocessed to reduce the influence of both very narrow frequency response distortions, as well as overall spectral shape differences on the following calculations. The preprocessing 77 may consists in smoothing, compressing and flattening the power spectrum. The smoothing operation is performed using a sliding window average in 78 of the powers over the FFT bands, while the compression is done by simply taking the logarithm 79 of the smoothed power in each band. The overall shape of the power spectrum is further flattened by performing sliding window normalization in 80 of the smoothed log powers over the FFT bands. Next the pitches of the current reference and degraded frame are computed using a stochastic subharmonic pitch algorithm. The ratio 74 of the reference to degraded pitch ration is then used to determine (in step 84) a range of possible warping factors. If possible, this search range is extended by using the pitch ratios for the preceding and following frame pair.

The frequency align algorithm then iterates through the search range and warps 85 the degraded power spectrum with the warping factor of the current iteration, and processes 88 the warped power spectrum using the preprocessing 77 described above. The correlation of the processed reference and processed warped degraded spectrum is then computed (in step 89) for bins below 1500 Hz. After complete iteration through the search range, the "best" (i.e. that resulted in the highest correlation) warping factor is retrieved in step 90. The correlation of the processed reference and best warped degraded spectra is then compared against the correlation of the original processed reference and degraded spectra. The "best" warping factor is then kept 97 if the correlation increases by a set threshold. If necessary, the warping factor is limited in 98 by a maximum relative change to the warping factor determined for the previous frame pair.

After the dewarping that may be necessary for aligning the frequency axis of reference and degraded, the frequency scale in Hz is warped in steps 21 and 54 towards the pitch scale in Bark reflecting that at low frequencies, the human hearing system has a finer frequency resolution than at high frequencies. This is implemented by binning FFT bands and summing the corresponding powers of the FFT bands with a normalization of the summed parts. The warping function that maps the frequency scale in Hertz to the pitch scale in Bark approximates the values given in the literature for this purpose, and known to the skilled reader. The resulting reference and degraded signals are known as the pitch power densities $PPX(f)_n$ (not indicated in FIG. 1) and $PPY(f)_n$ 56 with f the frequency in Bark and the index n representing the frame index.

Computation of the Speech Active, Silent and Super Silent Frames (Step 25)

POLQA operates on three classes of frames, which are distinguished in step 25:

speech active frames where the frame level of the reference signal is above a level that is about 20 dB below the average, silent frames where the frame level of the reference signal is below a level that is about 20 dB below the average and super silent frames where the frame level of the reference signal is below a level that is about 35 dB below the average level.

Calculation of the Frequency, Noise and Reverb Indicators

The global impact of frequency response distortions, noise and room reverberations is separately quantified in step 40. For the impact of overall global frequency response distortions, an indicator 41 is calculated from the average spectra of reference and degraded signals. In order to make the estimate of the impact for frequency response distortions independent of additive noise, the average noise spectrum density of the degraded over the silent frames of the reference signal is subtracted from the pitch loudness density of the degraded signal. The resulting pitch loudness density of the degraded and the pitch loudness density of the reference are then averaged in each Bark band over all speech active frames for the reference and degraded file. The difference in pitch loudness density between these two densities is then integrated over the pitch to derive the indicator 41 for quantifying the impact of frequency response distortions (FREQ).

For the impact of additive noise, an indicator 42 is calculated from the average spectrum of the degraded signal over the silent frames of the reference signal. The difference between the average pitch loudness density of the degraded over the silent frames and a zero reference pitch loudness density determines a noise loudness density function that quantifies the impact of additive noise. This noise loudness density function is then integrated over the pitch to derive an average noise impact indicator 42 (NOISE). This indicator 42 is thus calculated from an ideal silence so that a transparent chain that is measured using a noisy reference signal will thus not provide the maximum MOS score in the final POLQA end-to-end speech quality measurement.

For the impact of room reverberations, the energy over time function (ETC) is calculated from the reference and degraded time series. The ETC represents the envelope of the impulse response h(t) of the system H(f), which is defined as $Y_a(f)=H(f) \cdot X(f)$, where $Y_a(f)$ is the spectrum of a level aligned representation of the degraded signal and X(f) the spectrum of the reference signal. The level alignment is carried out to suppress global and local gain differences between the reference and degraded signal. The impulse response h(t) is calculated from H(f) using the inverse discrete Fourier transform. The ETC is calculated from the absolute values of h(t) through normalization and clipping. Based on the ETC up to three reflections are searched. In a first step the loudest reflection is calculated by simply determining the maximum value of the ETC curve after the direct sound. In the POLQA model direct sound is defined as all sounds that arrive within 60 ms. Next a second loudest reflection is determined over the interval without the direct sound and without taking into account reflections that arrive within 100 ms from the loudest reflection. Then the third loudest reflection is determined over the interval without the direct sound and without taking into account reflections that arrive within 100 ms from the loudest and second loudest reflection. The energies and delays of the three loudest reflections are then combined into a single reverb indicator 43 (REVERB).

Global and Local Scaling of the Reference Signal Towards the Degraded Signal (Step 26)

The reference signal is now in accordance with step 17 at the internal ideal level, i.e. about 73 dB SPL equivalent, while the degraded signal is represented at a level that coincides with the playback level as a result of 46. Before a comparison is made between the reference and degraded signal the global level difference is compensated in step 26. Furthermore small changes in local level are partially compensated to account for the fact that small enough level variations are not noticeable to subjects in a listening-only situation. The global level equalization 26 is carried out on the basis of the average power of reference and degraded signal using the frequency components between 400 and 3500 Hz. The reference signal is globally scaled towards the degraded signal and the impact of the global playback level difference is thus maintained at this stage of processing. Similarly, for slowly varying gain distortions a local scaling is carried out for level changes up to about 3 dB using the full bandwidth of both the reference and degraded speech file.

Partial Compensation of the Original Pitch Power Density for Linear Frequency Response Distortions (Step 27)

In order to correctly model the impact of linear frequency response distortions, induced by filtering in the system under test, a partial compensation approach is used in step 27. To model the imperceptibility of moderate linear frequency response distortions in the subjective tests, the reference signal is partially filtered with the transfer characteristics of the system under test. This is carried out by calculating the average power spectrum of the original and degraded pitch power densities over all speech active frames. Per Bark bin, a partial compensation factor is calculated 27 from the ratio of the degraded spectrum to the original spectrum.

Modelling of Masking Effects, Calculation of the Pitch Loudness Density Excitation Masking is modelled in steps 30 and 58 by calculating a smeared representation of the pitch power densities. Both time and frequency domain smearing are taken into account in accordance with the principles illustrated in FIG. 5a through 5c. The time-frequency domain smearing uses the convolution approach. From this smeared representation, the representations of the reference and degraded pitch power density are re-calculated suppressing low amplitude time-frequency components, which are partially masked by neighbouring loud components in the in the time-frequency plane. This suppression is implemented in two different manners, a subtraction of the smeared representation from the non-smeared representation and a division of the non-smeared representation by the smeared representation. The resulting, sharpened, representations of the pitch power density are then transformed to pitch loudness density representations using a modified version of Zwicker's power law:

$$LX(f)_n = SL * \left(\frac{P_0(f)}{0.5}\right)^{0.22*f_B*P_{fn}} * \left[\left(0.5 + 0.5\frac{PPX(f)_n}{P_0(f)}\right)^{0.22*f_B*P_{fn}} - 1\right]$$

with SL the loudness scaling factor, P0(f) the absolute hearing threshold, fB and Pfn a frequency and level dependent correction defined by:

$f_B = -0.03*f + 1.06$ for $f < 2.0$ Bark $f_B = 1.0$ for $2.0 \leq f \leq 22$ Bark $f_B = -0.2*(f-22.0) + 1.0$ for $f > 22.0$ Bark $P_{fn} = (PPX(f)_n + 600)^{0.008}$ with f representing the frequency in Bark, $PPX(f)_n$ the pitch power density in frequency time cell f, n. The resulting two dimensional arrays $LX(f)_n$ and $LY(f)_n$ are called pitch loudness densities, at the output of step 30 for the reference signal X(t) and step 58 for the degraded signal Y(t) respectively.

Global Low Level Noise Suppression in Reference and Degraded Signals

Low levels of noise in the reference signal, which are not affected by the system under test (e.g., a transparent system) will be attributed to the system under test by subjects due to the absolute category rating test procedure. These low levels of noise thus have to be suppressed in the calculation of the internal representation of the reference signal. This "idealization process" is carried out in step 33 by calculating the average steady state noise loudness density of the reference signal $LX(f)_n$ over the super silent frames as a function of pitch. This average noise loudness density is then partially subtracted from all pitch loudness density frames of the reference signal. The result is an idealized internal representation of the reference signal, at the output of step 33.

Steady state noise that is audible in the degraded signal has a lower impact than non-steady state noise. This holds for all levels of noise and the impact of this effect can be modelled by partially removing steady state noise from the degraded signal. This is carried out in step 60 by calculating the average steady state noise loudness density of the degraded signal $LY(f)_n$ frames for which the corresponding frame of the reference signal is classified as super silent, as a function of pitch. This average noise loudness density is then partially subtracted from all pitch loudness density frames of the degraded signal. The partial compensation uses a different strategy for low and high levels of noise. For low levels of noise the compensation is only marginal while the suppression that is used becomes more aggressive for loud additive noise. The result is an internal representation 61 of the degraded signal with an additive noise that is adapted to the subjective impact as observed in listening tests using an idealized noise free representation of the reference signal.

In step 33 above, in addition to performing the global low level noise suppression, also the LOUDNESS indicator 32 is determined for each of the reference signal frames. The LOUDNESS indicator or LOUDNESS value may be used to determine a loudness dependent weighting factor for weighing specific types of distortions. The weighing itself may be implemented in steps 125 and 125' for the four representations of distortions provided by operators 7, 8, 9 and 10, upon providing the final disturbance densities 142 and 143.

Here, the loudness level indicator has been determined in step 33, but one may appreciate that the loudness level indicator may be determined for each reference signal frame in another part of the method. In step 33 determining the loudness level indicator is possible due to the fact that already the average steady state noise loud density is determined for reference signal $LX(f)_n$ over the super silent frames, which are then used in the construction of the noise free reference signal for all reference frames. However, although it is possible to implement this in step 33, it is not the most preferred manner of implementation.

Alternatively, the loudness level indicator (LOUDNESS) may be taken from the reference signal in an additional step following step 35. This additional step is also indicated in FIG. 1 as a dotted box 35' with dotted line output (LOUDNESS) 32'. If implemented there in step 35', it is no longer necessary to take the loudness level indicator from step 33, as the skilled reader may appreciate.

Local Scaling of the Distorted Pitch Loudness Density for Time-Varying Gain Between Degraded and Reference Signal (Steps 34 and 63)

Slow variations in gain are inaudible and small changes are already compensated for in the calculation of the reference signal representation. The remaining compensation necessary before the correct internal representation can be calculated is carried out in two steps; first the reference is compensated in step 34 for signal levels where the degraded signal loudness is less than the reference signal loudness, and second the degraded is compensated in step 63 for signal levels where the reference signal loudness is less than the degraded signal loudness.

The first compensation 34 scales the reference signal towards a lower level for parts of the signal where the degraded shows a severe loss of signal such as in time clipping situations. The scaling is such that the remaining difference between reference and degraded represents the impact of time clips on the local perceived speech quality. Parts where the reference signal loudness is less than the degraded signal loudness are not compensated and thus additive noise and loud clicks are not compensated in this first step.

The second compensation 63 scales the degraded signal towards a lower level for parts of the signal where the degraded signal shows clicks and for parts of the signal where there is noise in the silent intervals. The scaling is such that the remaining difference between reference and degraded represents the impact of clicks and slowly changing additive noise on the local perceived speech quality. While clicks are compensated in both the silent and speech active parts, the noise is compensated only in the silent parts.

Partial Compensation of the Original Pitch Loudness Density for Linear Frequency Response Distortions (Step 35)

Imperceptible linear frequency response distortions were already compensated by partially filtering the reference signal in the pitch power density domain in step 27. In order to further correct for the fact that linear distortions are less objectionable than non-linear distortions, the reference signal is now partially filtered in step 35 in the pitch loudness domain. This is carried out by calculating the average loudness spectrum of the original and degraded pitch loudness densities over all speech active frames. Per Bark bin, a partial compensation factor is calculated from the ratio of the degraded loudness spectrum to the original loudness spectrum. This partial compensation factor is used to filter the reference signal with smoothed, lower amplitude, version of the frequency response of the system under test. After this filtering, the difference between the reference and degraded pitch loudness densities that result from linear frequency response distortions is diminished to a level that represents the impact of linear frequency response distortions on the perceived speech quality.

Final Scaling and Noise Suppression of the Pitch Loudness Densities

Up to this point, all calculations on the signals are carried out on the playback level as used in the subjective experiment. For low playback levels, this will result in a low difference between reference and degraded pitch loudness densities and in general in a far too optimistic estimation of the listening speech quality. In order to compensate for this effect the degraded signal is now scaled towards a "virtual" fixed internal level in step 64. After this scaling, the reference signal is scaled in step 36 towards the degraded signal level and both the reference and degraded signal are now ready for a final noise suppression operation in 37 and 65 respectively. This noise suppression takes care of the last parts of the steady state noise levels in the loudness domain that still have a too big impact on the speech quality calculation. The resulting signals 13 and 14 are now in the perceptual relevant internal representation domain and from the ideal pitch-loudness-time LX ideal$(f)_n$ 13 and degraded pitch-loudness-time $LY_{deg}(f)_n$ 14 functions the disturbance densities 142 and 143 can be calculated. Four different variants of the ideal and degraded pitch-loudness-time functions are calculated in 7, 8, 9 and 10, two variants (7 and 8) focussed on the disturbances for normal and big distortions, and two (9 and 10) focussed on the added disturbances for normal and big distortions.

Calculation of the Final Disturbance Densities

Two different flavours of the disturbance densities 142 and 143 are calculated. The first one, the normal disturbance density, is derived in 7 and 8 from the difference between the ideal pitch-loudness-time $LX_{ideal}(f)_n$ and degraded pitch-loudness-time function $LY_{deg}(f)_n$. The second one is derived in 9 and 10 from the ideal pitch-loudness-time and the degraded pitch-loudness-time function using versions that are optimized with regard to introduced degradations and is called added disturbance. In this added disturbance calculation, signal parts where the degraded power density is larger than the reference power density are weighted with a factor dependent on the power ratio in each pitch-time cell, the asymmetry factor.

In order to be able to deal with a large range of distortions two different versions of the processing are carried out, one focussed on small to medium distortions based on 7 and 9 and one focussed on medium to big distortions based on 8 and 10. The switching between the two is carried out on the basis of a first estimation from the disturbance focussed on small to medium level of distortions. This processing approach leads to the necessity of calculating four different ideal pitch-loudness-time functions and four different degraded pitch-loudness-time functions in order to be able to calculate a single disturbance and a single added disturbance function (see FIG. 3) which are then compensated for a number of different types of severe amounts of specific distortions.

Severe deviations of the optimal listening level are quantified in 127 and 127' by an indicator directly derived from the signal level of the degraded signal. This global indicator (LEVEL) is also used in the calculation of the MOS-LQO.

Severe distortions introduced by frame repeats are quantified 128 and 128' by an indicator derived from a comparison of the correlation of consecutive frames of the reference signal with the correlation of consecutive frames of the degraded signal.

Severe deviations from the optimal "ideal" timbre of the degraded signal are quantified 129 and 129' by an indicator derived from the difference in loudness between an upper frequency band and a lower frequency band. A timbre indicator is calculated from the difference in loudness in the Bark bands between 2 and 12 Bark in the low frequency part and 7-17 Bark in the upper range. (i.e. using a 5 Bark overlap) of the degraded signal which "punishes" any severe imbalances irrespective of the fact that this could be the result of an incorrect voice timbre of the reference speech file. Compensations are carried out per frame and on a global level. This compensation calculates the power in the lower and upper Bark bands (below 12 and above 7 Bark, i.e. using a 5 Bark overlap) of the degraded signal and "punishes" any severe imbalance irrespective of the fact that this could be the result of an incorrect voice timbre of the reference speech file. Note that a transparent chain using poorly recorded reference signals, containing too much noise and/or an incorrect voice timbre, will thus not provide the maximum MOS score in a POLQA end-to-end speech quality measurement. This compensation also has an impact when measuring the quality of devices which are transparent. When reference signals are used that show a significant deviation from the optimal "ideal" timbre the system under test will be judged as non-transparent even if the system does not introduce any degradation into the reference signal.

The impact of severe peaks in the disturbance is quantified in 130 and 130' in the FLATNESS indicator which is also used in the calculation of the MOS-LQO.

Severe noise level variations which focus the attention of subjects towards the noise are quantified in 131 and 131' by a noise contrast indicator derived from the degraded signal frames for which the corresponding reference signal frames are silent.

In steps 133 and 133', a weighting operation is performed for weighing disturbances dependent on whether or not they coincide with the actual spoken voice. In order to assess the intelligibility of the degraded signal, disturbances which are perceived during silent periods are not considered to be as detrimental as disturbances which are perceived during actual spoken voice. Therefore, based on the LOUDNESS indicator determined in step 33 (or alternatively step 35') from the reference signal, a weighting value is determined for weighing any disturbances. The weighting value is used for weighing the difference function (i.e. disturbances) for incorporating the impact of the disturbances on the intelligibility of the degraded speech signal into the evaluation. In particular, since the weighting value is determined based on the LOUDNESS indicator, the weighting value may be represented by a loudness dependent function. The loudness dependent weighting value may be determined by comparing the loudness value to a threshold. If the loudness indicator exceeds the threshold the perceived disturbances are fully taken in consideration when performing the evaluation. On the other hand, if the loudness value is smaller than the threshold, the weighting value is made dependent on the loudness level indicator; i.e. in the present example the weighting value is equal to the loudness level indicator (in the regime where LOUDNESS is below the threshold). The advantage is that for weak parts of the speech signal, e.g. at the ends of spoken words just before a pause or silence, disturbances are taken partially into account as being detrimental to the intelligibility. As an example, one may appreciate that a certain amount of noise perceived while speaking out the letter T at the end of a word, may cause a listener to perceive this as being the letter 's'. This could be detrimental to the intelligibility. On the other hand, the skilled person may appreciate that it is also possible to simply disregard any noise during silence or pauses, by turning the weighting value to zero when the loudness value is below the above mentioned threshold.

Figure 3:
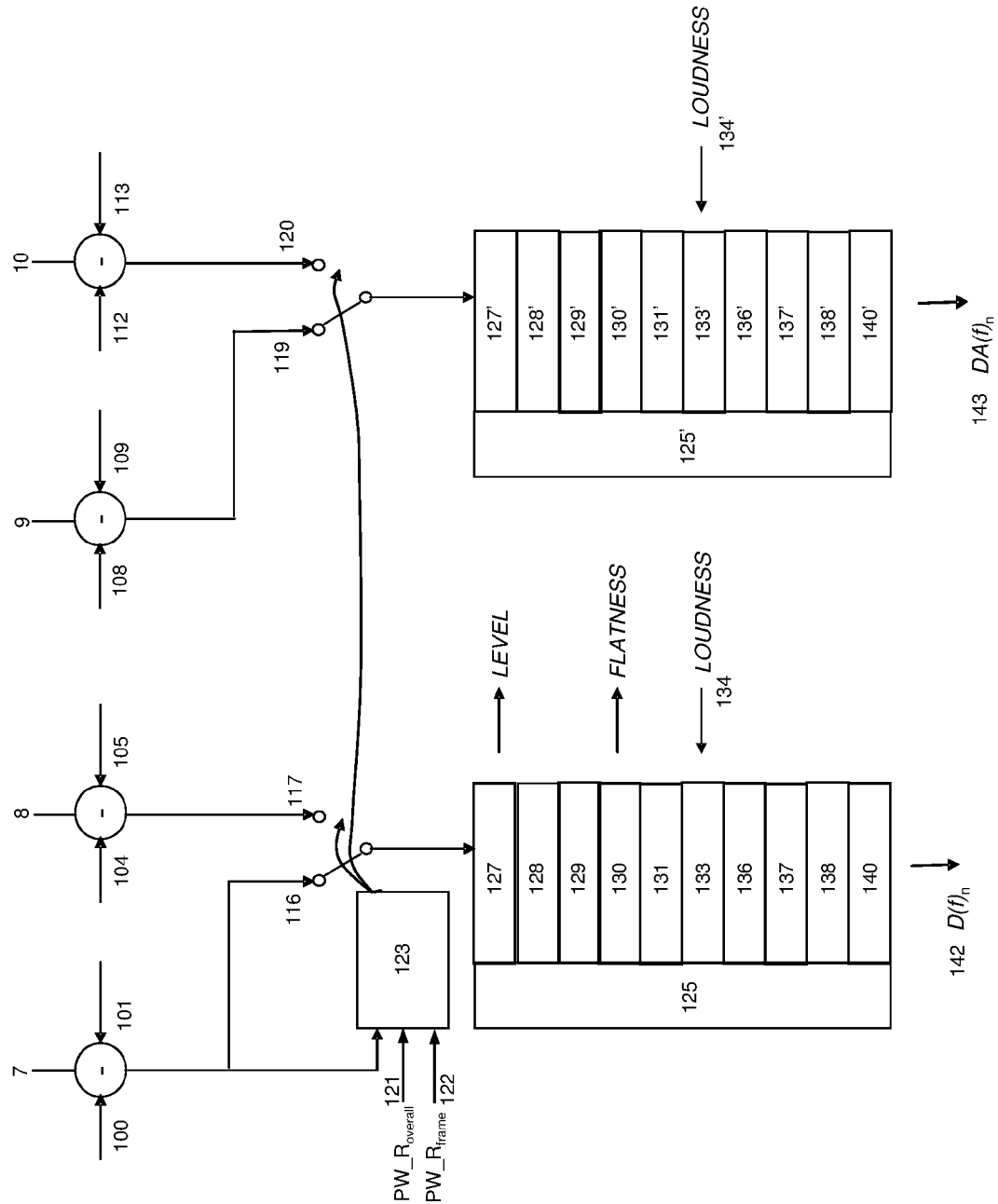
FIG. 3 provides an overview of the second part of the POLQA perceptual model, following on the first part illustrated in FIG. 1, in an embodiment in accordance with the invention.

Proceeding again with FIG. 3, severe jumps in the alignment are detected in the alignment and the impact is quantified in steps 136 and 136' by a compensation factor.

Finally the disturbance and added disturbance densities are clipped in 137 and 137' to a maximum level and the variance of the disturbance 138 and 138' and the impact of jumps 140 and 140' in the loudness of the reference signal are used to compensate for specific time structures of the disturbances.

This yields the final disturbance density $D(f)_n$ 142 for regular disturbance and the final disturbance density $DA(f)_n$ 143 for added disturbance.

Aggregation of the Disturbance Over Pitch, Spurts and Time, Mapping to Intermediate MOS Score The final disturbance $D(f)_n$ 142 and added disturbance $DA(f)_n$ densities 143 are integrated per frame over the pitch axis resulting in two different disturbances per frame, one derived from the disturbance and one derived from the added disturbance, using an $L_1$ integration 153 and 159 (see FIG. 4):

$$D_n = \sum_{f=1,\ldots \text{Number of Barkbands}} |D(f)_n| W_f$$

$$DA_n = \sum_{f=1,\ldots \text{Number of Barkbands}} |DA(f)_n| W_f$$

with $W_f$ a series of constants proportional to the width of the Bark bins.

Next these two disturbances per frame are averaged over a concatenation of six consecutive speech frames, defined as a speech spurt, with an $L_4$ 155 and an $L_1$ 160 weighing for the disturbance and for the added disturbance, respectively.

$$DS_n = \sqrt[4]{\frac{1}{6} \sum_{m=n,\ldots n+6} D_m^4}$$

$$DAS_n = \frac{1}{6} \sum_{m=n,\ldots n+6} D_m$$

Finally a disturbance and an added disturbance are calculated per file from an $L_2$ 156 and 161 averaging over time:

$$D = \sqrt[2]{\frac{1}{numberOfFrames} \sum_{n=1,\ldots numberOfFrames} DS_n^2}$$

$$DS = \sqrt[2]{\frac{1}{numberOfFrames} \sum_{n=1,\ldots numberOfFrames} DAS_n^2}$$

The added disturbance is compensated in step 161 for loud reverberations and loud additive noise using the REVERB 42 and NOISE 43 indicators. The two disturbances are then combined 170 with the frequency indicator 41 (FREQ) to derive an internal indicator that is linearized with a third order regression polynomial to get a MOS like intermediate indicator 171.

Computation of the Final POLQA MOS-LQO

The raw POLQA score is derived from the MOS like intermediate indicator using four different compensations all in step 175:

two compensations for specific time-frequency characteristics of the disturbance, one calculated with an $L_{511}$ aggregation over frequency 148, spurts 149 and time 150, and one calculated with an $L_{313}$ aggregation over frequency 145, spurts 146 and time 147 one compensation for very low presentation levels using the LEVEL indicator one compensation for big timbre distortions using the FLATNESS indicator in the frequency domain.

The training of this mapping is carried out on a large set of degradations, including degradations that were not part of the POLQA benchmark. These raw MOS scores 176 are for the major part already linearized by the third order polynomial mapping used in the calculation of the MOS like intermediate indicator 171.

Finally the raw POLQA MOS scores 176 are mapped in 180 towards the MOS-LQO scores 181 using a third order polynomial that is optimized for the 62 databases as were available in the final stage of the POLQA standardization. In narrowband mode the maximum POLQA MOS-LQO score is 4.5 while in super-wideband mode this point lies at 4.75. An important consequence of the idealization process is that under some circumstances, when the reference signal contains noise or when the voice timbre is severely distorted, a transparent chain will not provide the maximum MOS score of 4.5 in narrowband mode or 4.75 in super-wideband mode.

The consonant-vowel-consonant compensation, in accordance with the present invention, may be implemented as follows. In FIG. 1, reference signal frame 220 and degraded signal frame 240 may be obtained as indicated. For example, reference signal frame 220 may be obtained from the warping to bark step 21 of the reference signal, while the degraded signal frame may be obtained from the corresponding step 54 performed for the degraded signal. The exact location where the reference signal frame and/or the degraded signal frame are obtained from the method of the invention, as indicated in FIG. 1, is merely an example. The reference signal frame 220 and the degraded signal frame 240 may be obtained from any of the other steps in FIG. 1, in particular somewhere between the input of reference signal X(t) 3 and the global and local scaling to the degraded level in step 26. The degraded signal frame may be obtained anywhere in between the input of the degraded signal Y(t) 5 and step 54.

Figure 6:
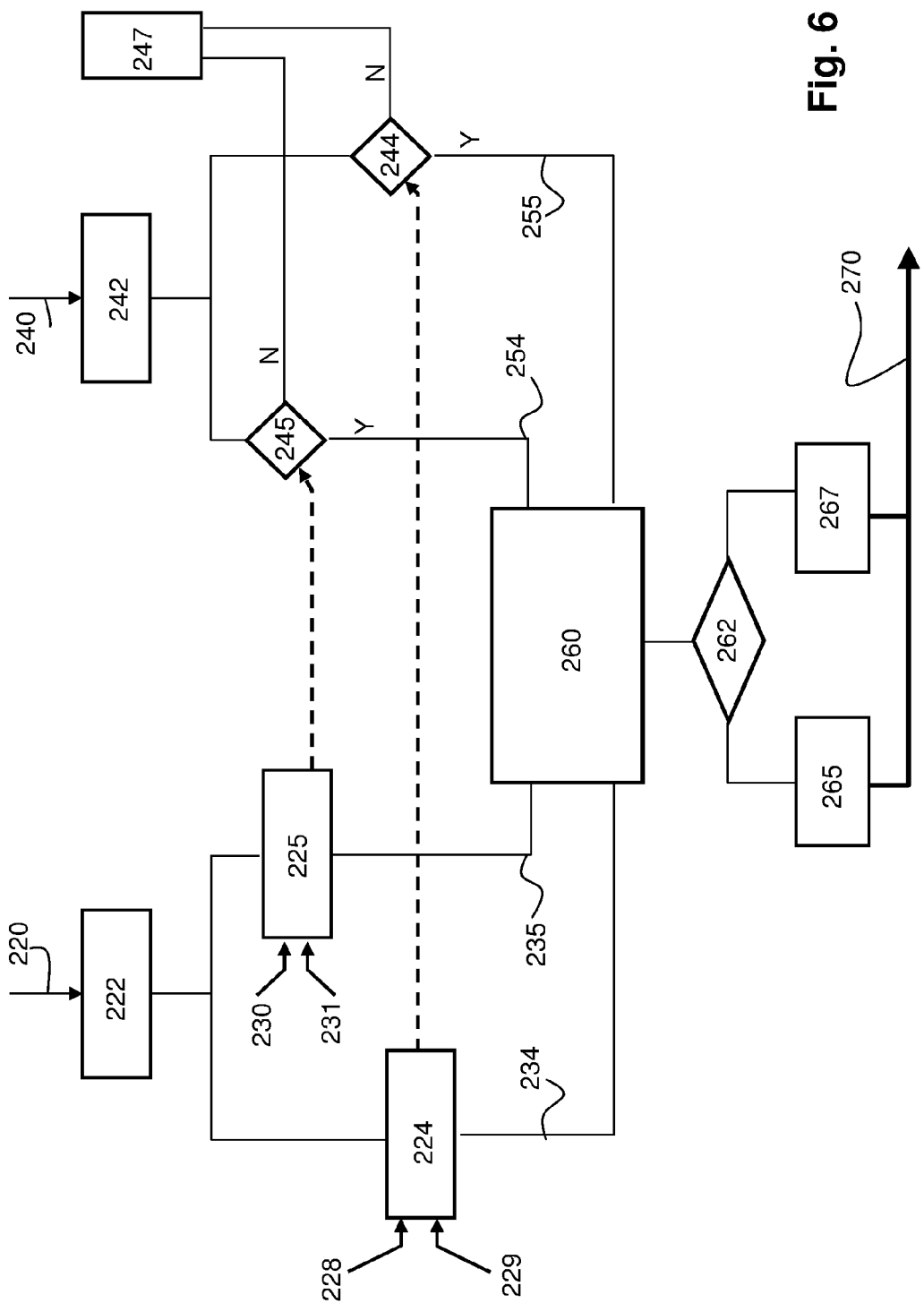
FIG. 6 is a schematic illustration of the manner of compensating the overall quality parameter in accordance with the method of the invention.

The consonant-vowel-consonant compensation continues as indicated in FIG. 6. First in step 222, the signal power of the reference signal frame 220 is calculated within the desired frequency domain. For the reference frame, this frequency domain in the most optimal situation includes only the speech signal (for example the frequency range between 300 hertz and 3500 hertz). Then, in step 224 a selection is performed as to whether or not to include this reference signal frame as an active speech reference signal frame by comparing the calculated signal power to a first threshold 228 and a second threshold 229. The first threshold may for example be equal to $7.0 \times 10^4$ when using a scaling of the reference signal as described in POLQA (ITU-T rec. P.863) and the second threshold may be equal to $2.0 \times 2 \times 10^8$. Likewise, in step 225, the reference signal frames are selected for processing which correspond to the soft speech reference signal (the critical part of the consonant), by comparing the calculated signal power to a third threshold 230 and a fourth threshold 231. The third threshold 230 may for example be equal to $2.0 \times 10^7$ and the fourth threshold may be equal to $7.0 \times 10^7$.

Steps 224 and 225 yield the reference signal frames that correspond to the active speech and soft speech parts, respectively the active speech reference signal part frames 234 and the soft speech reference signal parts frames 235. These frames are provided to step 260 to be discussed below.

Completely similar to the calculation of the relevant signal parts of the reference signal, also the degraded signal frames 240 are first, in step 242, analysed for calculating the signal power in the desired frequency domain. For the degraded signal frames, it will be advantageous to calculate the signal power within a frequency range including the spoken voice frequency range and the frequency range wherein most of the audible noise is present, for example the frequency range between 300 hertz and 8000 hertz.

From the calculated signal powers in step 242, the relevant frames are selected, i.e. the frames that are associated with the relevant reference frames. Selection takes place in steps 244 and 245. In step 245, for each degraded signal frame it is determined whether or not it is time aligned with a reference signal frame that is selected in step 225 as a soft speech reference signal frame. If the degraded frame is time aligned with a soft speech reference signal frame, the degraded frame is identified as a soft speech degraded signal frame, and the calculated signal power will be used in the calculation in step 260. Otherwise, the frame is discarded as soft speech degraded signal frame for calculation of the compensation factor in step 247. In step 244, for each degraded signal frame it is determined whether or not it is time aligned with a reference signal frame that is selected in step 224 as an active speech reference signal frame. If the degraded frame is time aligned with an active speech reference signal frame, the degraded frame is identified as an active speech degraded signal frame, and the calculated signal power will be used in the calculation in step 260. Otherwise, the frame is discarded as active speech degraded signal frame for calculation of the compensation factor in step 247. This yields the soft speech degraded signal parts frames 254 and the active speech degraded signal parts frames 255 which are provided to step 260.

Step 260 receives as input the active speech reference signal parts frames 234, the soft speech reference signal part frames 235, the soft speech degraded signal parts frames 254 and the active speech degraded signal parts frames 255. In step 260, the signal powers for these frames are processed such as to determine the average signal power for the active speech and soft speech reference signal parts and for the active speech and soft speech degraded signal parts, and from this (also in step 260) the consonant-vowel-consonant signal-to-noise ration compensation parameter ($CVC_{SNR\_factor}$) is calculated as follows:

$$CVC_{SNR\_factor} = \frac{(\Delta_2 + (P_{soft,degraded,average} + \Delta_1)/(P_{active,degraded,average} + \Delta_1))}{(\Delta_2 + (P_{soft,ref,average} + \Delta_1)/(P_{active,ref,average} + \Delta_1))}$$

The parameters $\Delta_1$ and $\Delta_2$ are constant values that are used to adapt the behavior of the model to the behavior of subjects. The other parameters in this formula are as follows: $P_{active,\ ref,\ average}$ is the average active speech reference signal part signal power. The parameter $P_{soft,\ ref,\ average}$ is the average soft speech reference signal part signal power. The parameter $P_{active,\ degraded,\ average}$ is the average active speech degraded signal part signal power, and the parameter $P_{soft,\ degraded,\ average}$ is the average soft speech degraded signal part signal power. At the output of step 260 there is provided the consonant-vowel-consonant signal-to-noise ratio compensation parameter $CVC_{SNR\_factor}$.

The $CVC_{SNR\_factor}$ is compared to a threshold value, in the present example 0.75 in step 262. If the $CVC_{SNR\_factor}$ is larger than this threshold, the compensation factor in step 265 will be determined as being equal to 1.0 (no compensation takes place). In case the $CVC_{SNR\_factor}$ is smaller than the threshold (here 0.75), the compensation factor is in step 267 calculated as follows: the compensation factor = $(CVC_{SNR\_factor} + 0.25)^{1/2}$ (note that the value 0.25 is taken to be equal to 1.0–0.75 wherein 0.75 is the threshold used for comparing the $CVC_{SNR\_factor}$). The compensation factor 270 thus provides is used in step 182 of FIG. 4 as a multiplier for the MOS-LQO score (i.e. the overall quality parameter). As will be appreciated, compensation (e.g. by multiplication) does not necessarily have to take place in step 182, but may be integrated in either one of steps 175 or 180 (in which case step 182 disappears from the scheme of FIG. 4). Moreover, in the present example compensation is achieved by multiplying the MOS-LQO score by the compensation factor calculated as indicated above. It will be appreciated that compensation may take another form as well. For example, it may also be possible to subtract or add a variable to the obtained MOS-LQO dependent on the $CVC_{SNR\_factor}$. The skilled person will appreciate and recognize other meanings of compensation in line with the present teaching.

The invention may be practised differently than specifically described herein, and the scope of the invention is not limited by the above described specific embodiments and drawings attached, but may vary within the scope as defined in the appended claims.

REFERENCE SIGNS 3 reference signal X(t)
5 degraded signal Y(t), amplitude-time 6 delay identification, forming frame pairs
7 difference calculation
8 first variant of difference calculation
9 second variant of difference calculation
10 third variant of difference calculation
12 difference signal
13 internal ideal pitch-loudness-time $LX_{ideal}{}^{(f)}{}_n$
14 internal degraded pitch-loudness-time $LY_{deg}{}^{(f)}{}_n$
17 global scaling towards fixed level
18 windowed FFT
20 scaling factor SP
21 warp to Bark
25 (super) silent frame detection
26 global & local scaling to degraded level
27 partial frequency compensation
30 excitation and warp to sone
31 absolute threshold scaling factor SL
32 LOUDNESS
32' LOUDNESS (determined according to alternative step 35')
33 global low level noise suppression
34 local scaling if Y<X
35 partial frequency compensation
35' (alternative) determine loudness
36 scaling towards degraded level
37 global low level noise suppression
40 FREQ NOISE REVERB indicators
41 FREQ indicator
42 NOISE indicator
43 REVERB indicator
44 $PW\_R_{overall}$ indicator (overall audio power ratio between degr. and ref. signal)
45 $PW\_R_{frame}$ indicator (per frame audio power ratio between degr. and ref. signal)
46 scaling towards playback level
47 calibration factor C
49 windowed FFT
52 frequency align
54 warp to Bark
55 scaling factor SP
56 degraded signal pitch-power-time $PPY^{(f)}{}_n$
58 excitation and warp to sone
59 absolute threshold scaling factor SL
60 global high level noise suppression
61 degraded signal pitch-loudness-time
63 local scaling if Y>X
64 scaling towards fixed internal level
65 global high level noise suppression
70 reference spectrum
72 degraded spectrum
74 ratio of ref and deg pitch of current and +/−1 surrounding frame
77 preprocessing
78 smooth out narrow spikes and drops in FFT spectrum
79 take log of spectrum, apply threshold for minimum intensity
80 flatten overall log spectrum shape using sliding window
83 optimization loop
84 range of warping factors: [min pitch ratio<=1<=max pitch ratio]
85 warp degraded spectrum
88 apply preprocessing
89 compute correlation of spectra for bins<1500 Hz
90 track best warping factor
93 warp degraded spectrum
94 apply preprocessing
95 compute correlation of spectra for bins<3000 Hz
97 keep warped degraded spectrum if correlation sufficient restore original otherwise
98 limit change of warping factor from one frame to the next
100 ideal regular
101 degraded regular
104 ideal big distortions
105 degraded big distortions
108 ideal added
109 degraded added
112 ideal added big distortions
113 degraded added big distortions
116 disturbance density regular select
117 disturbance density big distortions select
119 added disturbance density select
120 added disturbance density big distortions select
121 $PW\_R_{overall}$ input to switching function 123
122 $PW\_R_{frame}$ input to switching function 123
123 big distortion decision (switching)
125 correction factors for severe amounts of specific distortions
125' correction factors for severe amounts of specific distortions
127 level
127' level
128 frame repeat
128' frame repeat
129 timbre
129' timbre
130 spectral flatness
130' spectral flatness
131 noise contrast in silent periods
131' noise contrast in silent periods
133 loudness dependent disturbance weighing
133' loudness dependent disturbance weighing
134 Loudness of reference signal
134' Loudness of reference signal
136 align jumps
136' align jumps
137 clip to maximum degradation
137' clip to maximum degradation
138 disturbance variance
138' disturbance variance
140 loudness jumps
140' loudness jumps
142 final disturbance density $D^{(f)}{}_n$
143 final added disturbance density $DA^{(f)}{}_n$
145 $L_3$ frequency integration
146 $L_1$ spurt integration
147 $L_3$ time integration
148 $L_5$ frequency integration
149 $L_1$ spurt integration
150 $L_1$ time integration
153 $L_1$ frequency integration
155 $L_4$ spurt integration
156 $L_2$ time integration
159 $L_1$ frequency integration
160 $L_1$ spurt integration
161 $L_2$ time integration
170 mapping to intermediate MOS score
171 MOS like intermediate indicator
175 MOS scale compensations
176 raw MOS scores
180 mapping to MOS-LQO
181 MOS LQO
182 CVC intelligibility compensation
185 Intensity over time for short sinusoidal tone
187 short sinusoidal tone 188 masking threshold for a second short sinusoidal tone
195 Intensity over frequency for short sinusoidal tone
198 short sinusoidal tone
199 making threshold for a second short sinusoidal tone
205 Intensity over frequency and time in 3D plot
211 masking threshold used as suppression strength leading to a sharpened internal representation
220 Reference signal frame (see also FIG. 1)
222 Determine signal power in speech domain (e.g. 300 Hz-3500 Hz)
224 Compare signal power to first and second threshold and select if in range
225 Compare signal power to third and fourth threshold and select if in range
228 first threshold
229 second threshold
230 third threshold
231 fourth threshold
234 Power average of active speech reference signal frame
235 Power average of soft speech reference signal frame
240 Degraded signal frame (see also FIG. 1)
242 Determine signal power in domain for speech and audible disturbance (for example 300 Hz-8000 Hz)
244 Is degraded frame time aligned with selected active speech reference signal frame?
245 Is degraded frame time aligned with selected soft speech reference signal frame?
247 Frame discarded as active/soft speech degraded signal frame.
254 Power average of soft speech degraded signal frame
255 Power average of active speech degraded signal frame
260 Calculate consonant-vowel-consonant signal-to-noise ratio compensation parameter ($CVC_{SNR\_factor}$)
262 Is $CVC_{SNR\_factor}$ below threshold value (e.g. 0.75) for compensation
265 no→compensation factor=1.0 (no compensation)
267 yes→compensation factor is $(CVC_{SNR\_factor}+0.25)^{1/2}$
270 provide compensation value to step 182 for compensating MOS-LQO

The invention claimed is:

1. A non-transitory computer readable medium having a computer program embodied thereon for evaluating intelligibility of a degraded speech signal received from an audio transmission system, wherein a reference signal is conveyed through said audio transmission system to provide said degraded speech signal, wherein the reference speech signal conveys one or more words made up of combinations of consonants and vowels, the computer program including instructions for a programmable processor that, when executed by the programmable processor, cause the programmable processor to perform:
  sampling said reference speech signal into a plurality of reference signal frames, sampling said degraded speech signal into a plurality of degraded signal frames, and forming frame pairs by associating said reference signal frames and said degraded signal frames with each other;
  providing for each frame pair a difference function representing a difference between said degraded signal frame and said associated reference signal frame;
  compensating said difference function for one or more disturbance types such as to provide for each frame pair a disturbance density function which is adapted to a human auditory perception model;
  deriving from said disturbance density functions of a plurality of frame pairs an overall quality parameter, said quality parameter being at least indicative of said intelligibility of said degraded speech signal;
  wherein, said method further comprises the steps of:
  identifying, for at least one of said words conveyed by the reference speech signal, a reference signal part and a degraded signal part associated with at least one consonant of the at least one word;
  determining, from the identified reference and degraded signal parts, a degree of disturbance of the degraded speech signal based on a comparison of signal powers in the degraded signal part and the reference signal part; and
  compensating the overall quality parameter dependent on the determined degree of disturbance of the degraded speech signal associated with the at least one consonant, for compensating the overall quality parameter for disturbance coinciding with consonants in the degraded speech signal, and providing an output signal indicative of the overall quality parameter following the compensating.

2. The non-transitory computer readable medium according to claim 1, wherein said step of identifying is performed based on signal power of the reference speech signal.

3. The non-transitory computer readable medium according to claim 1, wherein said step of identifying comprises comparing a signal power of each of a plurality reference signal frames with a first threshold and a second threshold, and considering one or more of the reference signal frames as being associated with the at least one consonant if said signal power is larger than the first threshold and smaller than the second threshold.

4. The non-transitory computer readable medium according to claim 1, wherein said step of identifying comprises, after identifying the reference signal part, selecting one or more degraded signal frames associated with the at least one consonant by performing a time alignment with reference signal frames of the reference signal part associated with the at least one consonant, or by selection from frame pairs containing reference signal frames associated with the at least consonant.

5. The non-transitory computer readable medium according to claim 1, wherein said signal powers for degraded signal frames are calculated in a first frequency domain, and said signal powers for reference signal frames are calculated in a second frequency domain, said first frequency domain including a first frequency range of spoken voice and audible noise, preferably between 300 Hz and 8000 Hz, and said second frequency domain including a second frequency range of spoken voice, preferably between 300 Hz and 3500 Hz.

6. The non-transitory computer readable medium according to claim 1, wherein said step of identifying comprises:
  identifying, for the reference speech signal, active speech signal frames for which the signal powers are between a first and second threshold, and soft speech signal frames for which the signal powers are between a third and fourth threshold, and associating said active speech signal frames and soft speech signal frames with degraded signal frames such as to yield: active speech reference signal frames, soft speech reference signal frames, active speech degraded signal frames, and soft speech degraded signal frames; and
  wherein said comparison of signal powers comprises comparing signal powers of said active speech reference signal frames, said soft speech reference signal frames, said active speech degraded signal frames, and said soft speech degraded signal frames with each other.

7. The non-transitory computer readable medium according to claim 6, wherein said first threshold is smaller than said third threshold, third threshold is smaller than said fourth threshold, and said fourth threshold is smaller than said second threshold.

8. The non-transitory computer readable medium according to claim 7, wherein said second threshold is selected such as to exclude reference signal frames or degraded signal frames associated with one or more vowels.

9. The non-transitory computer readable medium according to claim 6, wherein said comparison of signal powers comprises:
calculating an average active speech reference signal part signal power $P_{active, ref, average}$; calculating an average soft speech reference signal part signal power $P_{soft, ref, average}$; calculating an average active speech degraded signal part signal power $P_{active, degraded, average}$; calculating an average soft speech degraded signal part signal power $P_{soft, degraded, average}$; and
determining the degree of disturbance of the degraded speech signal by calculating a consonant-vowel-consonant signal-to-noise ratio compensation parameter $CVC_{SNR\_factor}$ as:

$$CVC_{SNR\_factor} = \frac{(\Delta_2 + (P_{soft,degraded,average} + \Delta_1)/(P_{active,degraded,average} + \Delta_1))}{(\Delta_2 + (P_{soft,ref,average} + \Delta_1)/(P_{active,ref,average} + \Delta_1))}$$

wherein $\Delta_1$ and $\Delta_2$ are constants.

10. The non-transitory computer readable medium according to claim 1, wherein said step of compensating is performed by multiplying the overall quality parameter with a compensation factor.

11. The non-transitory computer readable medium according to claim 9,
wherein said step of compensating is performed by multiplying the overall quality parameter with a compensation factor, and
wherein the compensation factor is 1.0 if the consonant-vowel-consonant signal-to-noise ratio compensation parameter $CVC_{SNR\_factor}$ is larger than 0.75; and wherein the compensation factor is $(CVC_{SNR\_factor} + 0.25)^{1/2}$ if the consonant-vowel-consonant signal-to-noise ratio compensation parameter $CVC_{SNR\_factor}$ is smaller than 0.75.

12. A computer program product comprising the non-transitory computer readable medium of claim 1.

13. An apparatus for evaluating intelligibility of a degraded speech signal, comprising:
a receiver for receiving said degraded speech signal from an audio transmission system conveying a reference speech signal, the reference speech signal at least representing one or more words made up of combinations of consonants and vowels, and the receiver further configured for receiving the reference speech signal;
a sampler for sampling of said reference speech signal into a plurality of reference signal frames, and for sampling of said degraded speech signal into a plurality of degraded signal frames;
a processor for forming frame pairs by associating said reference signal frames and said degraded signal frames with each other, and for providing for each frame pair a difference function representing a difference between said degraded and said reference signal frame;
a compensator for compensating said difference function for one or more disturbance types such as to provide for each frame pair a disturbance density function which is adapted to a human auditory perception model; and
said processor further being configured for deriving from said disturbance density functions of a plurality of frame pairs an overall quality parameter being at least indicative of said intelligibility of said degraded speech signal;
wherein, said processor is further configured:
for identifying, for at least one of said words represented by the reference speech signal, a reference signal part and a degraded signal part associated with at least one consonant of the at least one word;
for determining, from the identified reference and degraded signal parts, a degree of disturbance of the degraded speech signal based on a comparison of signal powers in the degraded signal part and the reference signal part; and
for compensating the overall quality parameter dependent on the determined degree of disturbance of the degraded speech signal associated with the at least one consonant and providing an output signal indicative of the overall quality parameter following the compensating.

14. The apparatus according to claim 13, wherein for performing said identifying the processor is further configured for:
identifying for the reference speech signal, active speech signal frames for which the signal powers are between a first and second threshold, and soft speech signal frames for which the signal powers are between a third and fourth threshold, and associating said active speech signal frames and soft speech signal frames with degraded signal frames for providing: active speech reference signal frames, soft speech reference signal frames, active speech degraded signal frames, and soft speech degraded signal frames; and
wherein for performing said comparison of signal powers the processor is configured for comparing signal powers of said active speech reference signal frames, said soft speech reference signal frames, said active speech degraded signal frames, and said soft speech degraded signal frames with each other.

15. The apparatus according to claim 14, wherein for performing said comparison the processor is further configured for:
calculating an average active speech reference signal part signal power $P_{active, ref, average}$; calculating an average soft speech reference signal part signal power $P_{soft, ref, average}$; calculating an average active speech degraded signal part signal power $P_{active, degraded, average}$; calculating an average soft speech degraded signal part signal power $P_{soft, degraded, average}$; and for
determining the degree of disturbance of the degraded speech signal by calculating a consonant-vowel-consonant signal-to-noise ratio compensation parameter $CVC_{SNR\_factor}$ as:

$$CVC_{SNR\_factor} = \frac{(\Delta_2 + (P_{soft,degraded,average} + \Delta_1)/(P_{active,degraded,average} + \Delta_1))}{(\Delta_2 + (P_{soft,ref,average} + \Delta_1)/(P_{active,ref,average} + \Delta_1))}$$

wherein $\Delta_1$ and $\Delta_2$ are constants.

16. The apparatus according to claim 15, wherein for performing said compensating, the processor is further configured for multiplying the overall quality parameter with a compensation factor, wherein the compensation factor is 1.0 if the consonant-vowel-consonant signal-to-noise ratio compensation parameter $CVC_{SNR\_factor}$ is larger than 0.75; and wherein the compensation factor is $(CVC_{SNR\_factor}+0.25)^{1/2}$ if the consonant-vowel-consonant signal-to-noise ratio compensation parameter $CVC_{SNR\_factor}$ is smaller than 0.75.

* * * * *